United States Patent
Honda et al.

(10) Patent No.: US 6,717,852 B2
(45) Date of Patent: Apr. 6, 2004

(54) NONVOLATILE SEMICONDUCTOR MEMORY DEVICE CAPABLE OF CONCURRENTLY AND RELIABLY WRITING/ERASING AND READING MEMORY CORES

(75) Inventors: Yasuhiko Honda, Yokohama (JP); Hideo Kato, Kawasaki (JP); Masao Kuriyama, Fujisawa (JP); Hidetoshi Saito, Yamato (JP); Tokumasa Hara, Tachikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/267,693

(22) Filed: Oct. 10, 2002

(65) Prior Publication Data

US 2003/0072199 A1 Apr. 17, 2003

(30) Foreign Application Priority Data

Oct. 11, 2001 (JP) ........................................ 2001-314163

(51) Int. Cl.$^7$ ............................................. G11C 16/32
(52) U.S. Cl. ............................. 365/185.11; 365/185.33
(58) Field of Search ........................ 365/185.11, 185.33, 365/185.02

(56) References Cited

U.S. PATENT DOCUMENTS

| | | | |
|---|---|---|---|
| 5,841,696 A | 11/1998 | Chen et al. | 365/185.11 |
| 6,208,556 B1 | 3/2001 | Akaogi et al. | 365/185.11 |
| 6,243,313 B1 * | 6/2001 | Sakamoto et al. | 365/207 |
| 6,377,502 B1 | 4/2002 | Honda et al. | 365/185.11 |

FOREIGN PATENT DOCUMENTS

| | | | |
|---|---|---|---|
| EP | 1 052 647 | 11/2000 | G11C/16/10 |
| JP | 2001-325795 | 11/2001 | G11C/16/06 |

OTHER PUBLICATIONS

Pub. No.: US 2002/0031038 A1; Appl. No.: 09/987,981; Filed: Nov. 16, 2001; Inventors: Yasuhiko Honda et al.

* cited by examiner

Primary Examiner—Andrew Q. Tran
(74) Attorney, Agent, or Firm—Oblon, Spivak, McClelland, Maier & Neustadt, P.C.

(57) ABSTRACT

A semiconductor memory device, which allows concurrent execution of a write/erase operation and a read operation, is provided for each core with a core busy output circuit which has a function of, at the start, end, suspending or resuming of a write/erase operation, setting the sequence in which a command to write into/erase or read from a core, a core select signal indicating whether or not the core has been selected, and a busy signal indicating that the core is in the write/erase mode are set or reset so that multiple selection of a core in a write/erase operation and a core in a read operation does not occur.

10 Claims, 10 Drawing Sheets

NONVOLATILE SEMICONDUCTOR MEMORY DEVICE CAPABLE OF CONCURRENTLY AND RELIABLY WRITING/ERASING AND READING MEMORY CORES

CROSS-REFERENCE TO RELATED APPLICATIONS

This application is based upon and claims the benefit of priority from the prior Japanese Patent Application No. 2001-314163, filed Oct. 11, 2001, the entire contents of which are incorporated herein by reference.

BACKGROUND OF THE INVENTION

1. Field of the Invention

The present invention relates to an electrically erasable/rewritable nonvolatile semiconductor memory device (EEPROM) and more specifically to a semiconductor memory having a plurality of banks and adapted to, while performing a write or erase operation (hereinafter referred to as a write/erase operation) on a bank, allow another bank to be read from. That is, the present invention relates to a semiconductor memory (flash memory) which can perform a write/erase operation and a read operation at the same time and allows for batch erasing.

2. Description of the Related Art

In recent flash memories, in order to reduce the number of memory chips required for a system, a proposal has been made of a memory system, called RWW (Read While Write), which, while reading from a certain memory area, permits a write/erase operation to be performed on another memory area.

The same assignee as this application has proposed in Japanese Patent Application No. 2000-127106 a flash memory which allows concurrent execution of a write/erase operation and a read operation.

In such a flash memory, unless a bank to be written/erased and a bank to be read are completely electrically isolated from each other, multiple selection will occur between the banks, which may result in failure of data reading to be performed correctly.

In the semiconductor memory device proposed in the above Japanese Patent Application, it is important to prevent the multiple selection of a bank to be written/erased and a bank to be read while a write/erase operation and a read operation are performed concurrently.

A semiconductor memory device according to an aspect of the present invention allows, by timing properly the control signals at the start of a write/erase operation, a bank in a write/erase operation and a bank in a read operation to be isolated completely from each other so that they do not interfere with each other and multiple selection of a write/erase execution bank and a read execution bank to be prevented surely. Therefore, a write/erase operation and a read operation can be executed normally and concurrently.

A semiconductor memory device according to another aspect of the present invention allows, by timing properly the control signals at the end of a write/erase operation, a bank in a write/erase operation and a bank in a read operation to be isolated completely from each other so that they do not interfere with each other and multiple selection of a write/erase execution bank and a read execution bank to be prevented surely. Therefore, a write/erase operation and a read operation can be executed normally and concurrently.

A semiconductor memory device according to an aspect of the present invention allows, by timing properly the control signals at the suspending or resuming of a write/erase operation, a bank in a write/erase operation and a bank in a read operation to be isolated completely from each other so that they do not interfere with each other and multiple selection of a write/erase execution bank and a read execution bank to be prevented surely. Therefore, a write/erase operation and a read operation can be executed normally and concurrently.

BRIEF SUMMARY OF THE INVENTION

A first semiconductor memory device according to an embodiment of the present invention comprises: a memory cell array having electrically rewritable nonvolatile memory cells and divided into a plurality of cores each of which is composed of one or more blocks each comprised of a range of memory cells as a unit of data erasure; a core select circuit selecting an arbitrary number of cores from the plurality of cores for data writing/erasing; a data write circuit writing data into selected memory cells in a core selected by the core select circuit; a data erase circuit erasing data in a selected block in a core selected by the core select circuit; and a data read circuit reading data from memory cells in a core which is not selected by the core select circuit, the sequence in which, at the start of a write/erase operation, a command to write into/erase or read from a core, a core select signal indicating whether or not the core has been selected, and a busy signal indicating that the core is in the write/erase mode are set being set so that multiple selection of a core in a write/erase operation and a core in a read operation does not occur.

In a second semiconductor memory device according to an embodiment, the sequence in which, at the end of a write/erase operation, a command to write into/erase or read from a core, a core select signal indicating whether or not the core has been selected, and a busy signal indicating that the core is in the write/erase mode are reset being set so that multiple selection of a core in a write/erase operation and a core in a read operation does not occur.

In a third semiconductor memory device according to an embodiment, the sequence in which, at the suspending of a write/erase operation, a command to write into/erase or read from a core, a core select signal indicating whether or not the core has been selected, and a busy signal indicating that the core is in the write/erase mode are reset being set so that multiple selection of a core in a write/erase operation and a core in a read operation does not occur.

In a fourth semiconductor memory device according to an embodiment, the sequence in which, at the resuming of a write/erase operation which has been suspended, a command to write into/erase or read from a core, a core select signal indicating whether or not the core has been selected, and a busy signal indicating that the core is in the write/erase mode are set being set so that multiple selection of a core in a write/erase operation and a core in a read operation does not occur.

A fifth semiconductor memory device according to an embodiment of the present invention is configured so as to satisfy the four sequential relationships among the control signals at the start, end, suspending and resuming of a write/erase operation in the above first through fourth semiconductor memory devices.

DETAILED DESCRIPTION OF THE INVENTION

Figure 1:
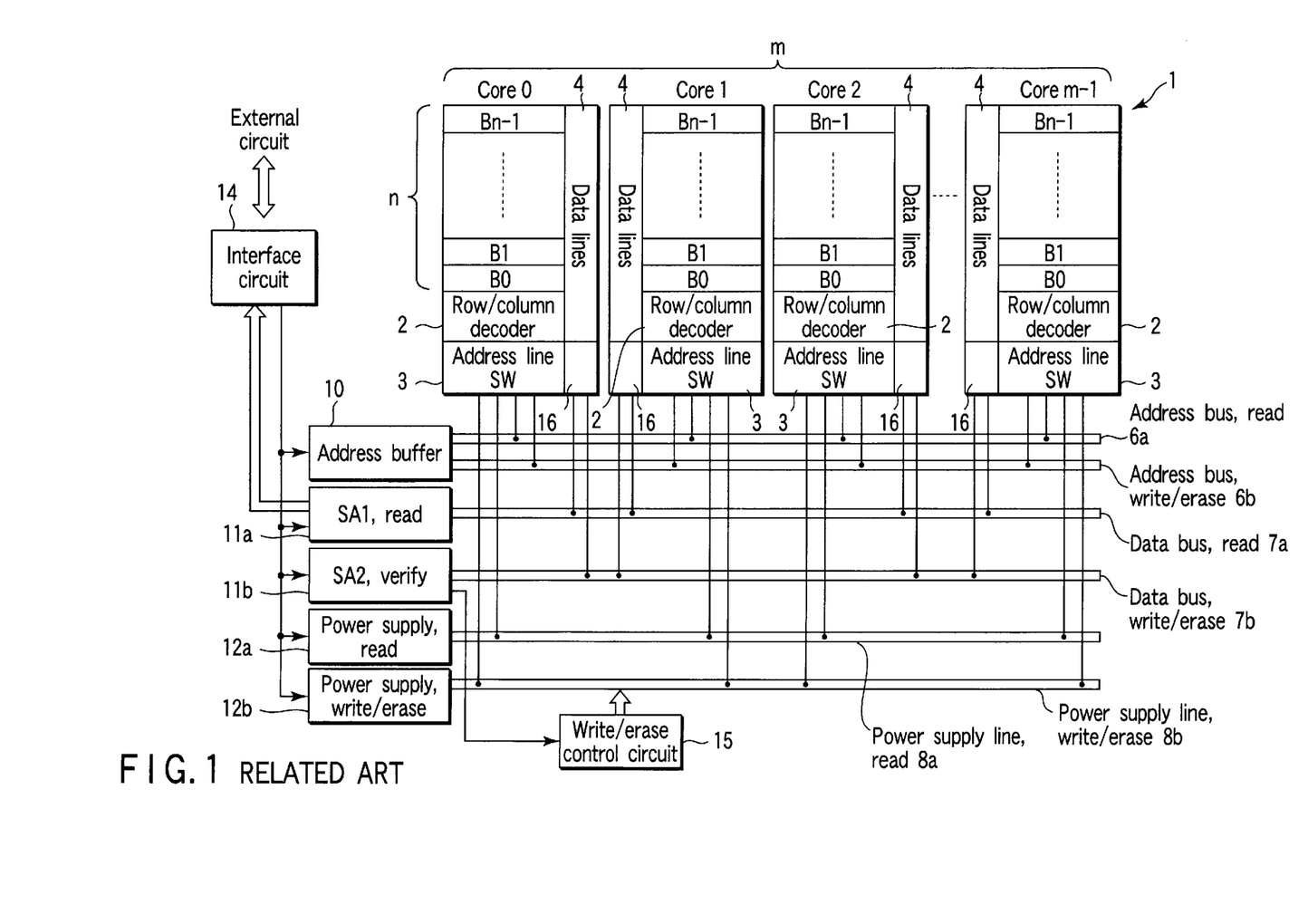
FIG. 1 is a block diagram illustrating an exemplary chip configuration of a flash memory in which a write/erase operation and a read operation can be performed concurrently and to which the present invention is applied.

FIG. 1 shows an example of chip configuration of a flash memory which is described in the aforementioned Japanese Patent Application No. 2000-127106 and allows concurrent execution of write/erase and read operations as a semiconductor memory device to which the present invention is applied.

Other chip configurations may be used as well, including those described in the above Japanese Patent Application No. 2000-127106, the entire contents of which are incorporated herein by reference.

In FIG. 1, the memory cell array, generally indicated at 1, is composed of m cores 0 to m−1 each of n blocks B0 to Bn−1. Each of the blocks B0 to Bn−1, which is a minimum unit of data erase, has an array of a plurality of memory cells. The memory cells are, for example, nonvolatile memory cells of stacked gate structure. Although each of the cores is defined as a group of one or more blocks, in the example of FIG. 1 it is composed of n blocks B0 to Bn−1, forming a bank of blocks.

Each core is provided with a row/column decoder 2 including a row decoder and a column decoder to make a selection from the memory cells, an address line/power supply line switch circuit (address line SW) 3 switching address lines and power supply lines, local data lines 4, and a data line switch circuit (data line SW) 16.

In common with all the cores of the memory cell array 1 are associated a first address bus (read address bus) 6a for selecting a memory cell in a read operation and a second address bus 6b (write/erase address bus) necessary for automatic operation in a write/erase operation.

Also, in common with all the cores of the memory cell array 1 are associated a first data bus (read data bus) 7a used in a read operation and a second data bus 7b (write/erase data bus) used in a write/erase operation.

With the data buses 7a and 7b are respectively associated a first sense amplifier (read sense amplifier) 11a used in a read operation and a second sense amplifier (verify sense amplifier) 11b used for verify read in a write/erase operation.

In common with all the cores are associated a first power supply line (read power supply line) 8a connected to a read power supply 12a to provide a read supply voltage and a second power supply line (write/erase power supply line) 8b connected to a write/erase power supply 12b to provide a write/erase supply voltage. In a read operation, the read power supply line 8a is supplied with a boosted voltage higher than a supply voltage Vcc, which in turn is applied to the gates of memory cells, allowing fast readout therefrom.

Further, there are provided an address buffer 10 which supplies address signals to the read address bus 6a and the write/erase address bus 6b and an interface circuit 14 which provides the interface between the memory device and external circuits.

That is, this flash memory includes a memory cell array in which a range of electrically rewritable nonvolatile memory cells as a unit of data erase is set as one block, one or more blocks are grouped into one core, and two or more cores are arrayed, a core select circuit which selects an arbitrary number of cores to be written/erased, a data write circuit which writes data into selected memory cells in the cores selected by the core select circuit, a data erase circuit which erases data in the selected blocks in the cores selected by the core select circuit, and a data read circuit which reads data from memory cells in non-selected cores.

Next, the operation of the flash memory thus configured will be described briefly.

An externally applied address input is applied to the address buffer 10 through an address input circuit in the interface circuit 14. The address input is sent from the address buffer 10 to either the read address bus 6a or the write/erase address bus 6b according to the mode of operation. The address input on the bus 6a or 6b is transferred to the row/column decoder 2 in each core through the corresponding address line switch circuit 3. The power supply line 8a or 8b is also selectively coupled to the row/column decoder 2 in each core through the corresponding switch circuit 3 according to the mode of operation.

In each core, the local data lines 4 are connected by the data line switch circuit 16 with the read data bus 7a in a read operation and with the write/erase data bus 7b in a write/erase operation.

That is, data in selected memory cells in each core are read onto the corresponding local data lines 4, then transferred to either the read data bus 7a or the write/erase data bus 7b according to the mode of operation and detected and sensed by either the read sense amplifier 11a or the verify sense amplifier 11b.

The output of the verify sense amplifier 11b is sent to the write/erase control circuit 15 to confirm whether writing/erasing has been performed correctly. If not, writing or erasing is performed again.

Thus, if a read operation and a write/erase operation are performed concurrently, each operation can be carried out independently through the use of its associated address bus, data bus, sense amplifier and power supply circuit.

Next, as an example of concurrent execution of a write operation and a read operation, an operation of writing into the core 0 and reading from another core will be described specifically.

When a core 0 select address signal and a write command are input from outside of the chip, the command is decoded in the interface circuit 14 to set the write flag. This flag enables the switching circuit 3 in the core 0 to input the address signal on the write/erase address bus 6b and the write voltage on the write/erase power supply 12b to the row/column decoder 2 in the core 0. Also, the data lines 4 in the core 0 are connected by the data line switch circuit 16 to the write/erase data bus 7b that is connected to the verify sense amplifier 11b.

Thus, by setting the address bus, the data bus, and the power supply line, the boosted write voltage is applied to the selected word line in the core 0 and a high or low voltage is applied from the write control circuit 15 to the selected bit line according to write data. Thereby, if each memory cell has the floating gate type MOS transistor structure, hot electrons will be injected into the floating gate of the selected memory cell, whereby data is written into the selected cell. At the termination of a single write operation, the written data is read and detected by the verify sense amplifier 11b. The result is verified by the write control circuit 15. If the writing has been performed successfully, then the write operation is complete; otherwise, additive writing is performed.

During writing into the core 0, any other core, for example, the core 1, can be read from. That is, by externally applied address information, the address signal on the read address bus 6a and the output potential of the read power supply 12a are applied to the row/column decoder 2 of the core 1 including a memory cell to be read from. The data lines 4 are coupled to the read data bus 7a through the switching circuit 16. No address signal is input to the row/column decoders of other cores that are not written into or read from. The read data bus or the write/erase data bus is also not connected to the data lines of these cores.

Data read from the selected memory cell in the core 1 is detected and amplified in the read sense amplifier 11a through the read data bus 7a. This read data is output to the outside of the chip through the interface circuit 14.

That is, any other core than the core 0 that is being written into, whether it be the core 2, the core 3, or the core m−1, can arbitrarily be read from. Inputting of address information associated with the core 0 that is being written into to read data therefrom is inhibited. Thus, if a request is made to read from a core that is being written into, a busy signal is output to the outside to indicate that the selected core is in a write operation.

The operation of performing erasing and reading concurrently also remains basically unchanged from the above operation of performing writing and reading concurrently.

A description is given here of an operation of performing erasing on a selected block in the core 0 and reading from a cell in another core.

When address information to select a block in the core 0 and an erase command are externally input, the erase command is decoded in the interface circuit 14 with the result that the erase flag is set. This flag allows the address signal on the write/erase bus 6b and the erasing potential of the write/erase power supply 12b to be input to the row/column decoder 2 in the core 0 through the corresponding switching circuit 3. Also, the data lines 4 in the core 0 are connected through the corresponding data line switching circuit 16 to the write/erase data bus 7b that is connected to the verify sense amplifier 11b.

By setting the address bus, the data bus, and the power supply line in this manner, a negative voltage is applied to all the word lines associated with the selected block in the core 0, the bit lines are made open, and a positive high erasing voltage is applied to the source lines, allowing erasing to be carried out on a block by block basis.

At the termination of a single erase operation, data is read and detected by the verify sense amplifier 11b. The control circuit 15 makes a determination of whether or not erasing has been performed successfully. If so, the operation is complete; otherwise, another erase operation is performed.

If, while the core 0 is subjected to an erase operation, a request is made to read from another core, then data is read from that core.

In this exemplary memory, a core is a set of blocks each of which is treated as one unit for erasing. More specifically, the core is defined as a set of blocks which share address lines, power supply lines and data lines and in which, when one of them is being accessed, access to any other block is inhibited.

Next, the arrangement of each component in FIG. 1 will be described.

Figure 2:
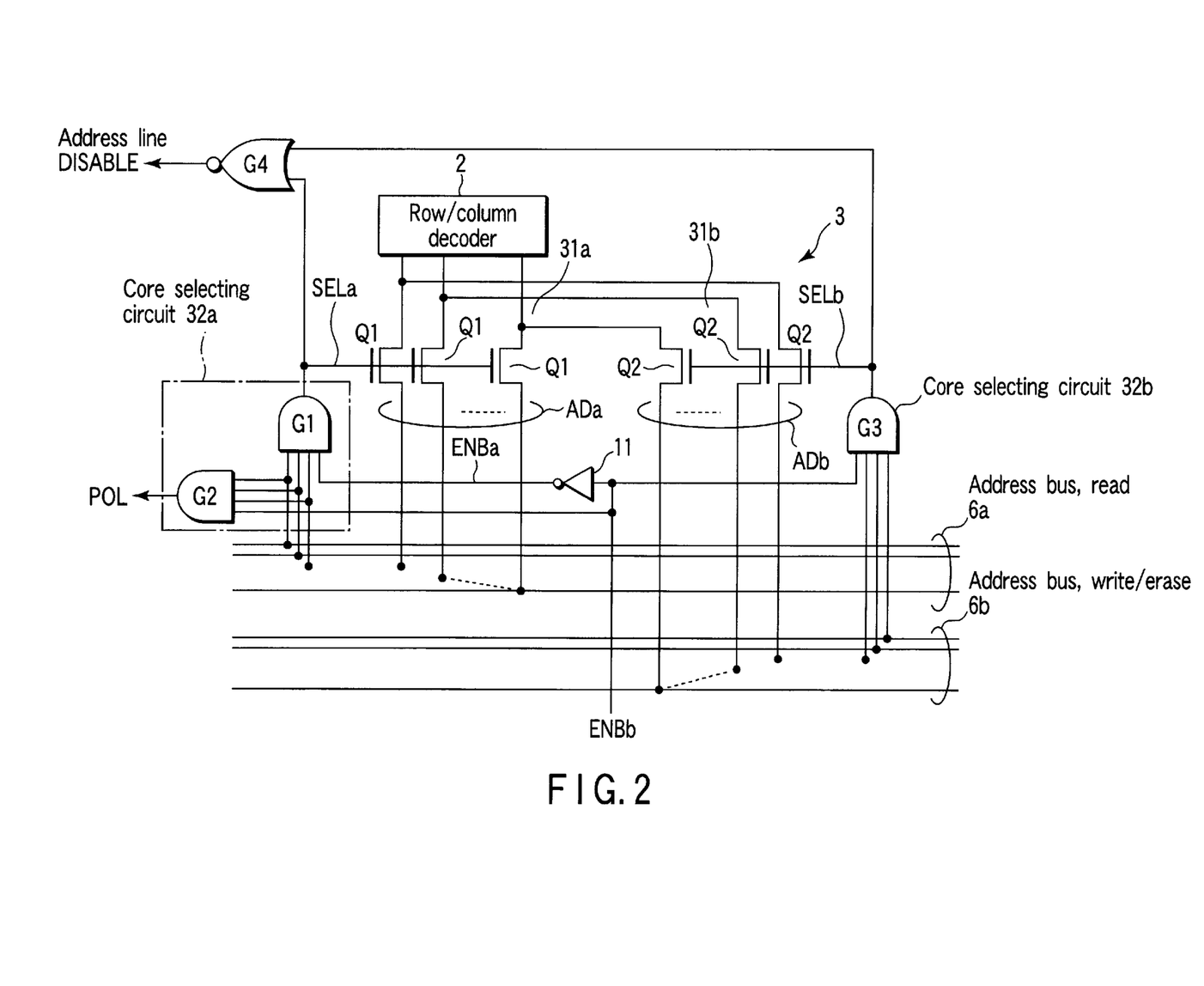
FIG. 2 shows an exemplary arrangement of the address line switch circuit in each of the cores of FIG. 1.

FIG. 2 shows the address line switching arrangement of the address line/power supply line switching circuit 3 in each of the cores in FIG. 1.

The switching circuit 3 includes two groups of select switches 31a and 31b and two core select circuits 32a and 32b each of which, when activated, drives a corresponding one of the two groups of switches. The selecting circuits 32a and 32b are activated by enable signals ENBa and ENBb, respectively.

The enable signal ENBb is a write/erase enable signal which goes high in response to entry of a write/erase command as will be described later. The enable signal ENBb, produced by inverting the enable signal ENBa by an inverter 11, is a read enable signal which goes high at the time data is read.

The core selecting circuit 32b is comprised of an AND gate G3 which is activated by the enable signal ENBb at a high level at the time data is written or erased. The AND gate G3 is connected to receive core selecting address information on the write/erase address bus 6b and produces a core select signal SELb at a high level when the corresponding core is selected.

This core select signal SELb turns on all the switches in the switch group 31b, thereby allowing write/erase address information ADb on the write/erase bus 6b to be entered into the row/column decoder 2 in the corresponding selected core.

The core selecting circuit 32a is comprised of an AND gate G1 which is activated by the read enable signal ENBa at a high level and connected to receive core selecting address information on the read address bus 6a. When the enable signal ENBb is high, the enable signal ENBa is low. The core select signal SELa from the AND gate G1 goes low when the corresponding core is selected for data writing/ erasing. At this point, the switches in the select switch group 31a are kept off. When the corresponding core is selected for data reading, the select signal SELa goes high, turning on the switches in the switch group 31a and allowing read address information on the read address bus 6a to be transferred to the row/column decoder 2.

As described above, this exemplary memory inhibits the write/erase core select signal SELb and the read core select signal SELa for one core from going high at the same time (glitch). For this reason, when a certain core is being written into or erased, it cannot be read from.

The core select circuit 32a is further provided with an AND gate G2 which, like the AND gate G1, is connected to receive the read core select address information. This AND gate G2 is a data polling signal generation circuit which, when a read request is made on a core that is being written into or erased, generates signals that core being in a write/erase operation. The AND gate G2 is activated by the write/erase enable signal ENBb. Thus, when a read request is made on the corresponding core that is in a write/erase operation, the AND gate G2 outputs a data polling signal POL at a high level while the core select signal SELa is held low.

The state where the two core select signals SELa and SELb are both low indicates that the corresponding core is non-selected. This state is detected by a NOR gate G4, which outputs a signal DISABLE that makes inactive the address lines associated with the non-selected core.

Figure 3:
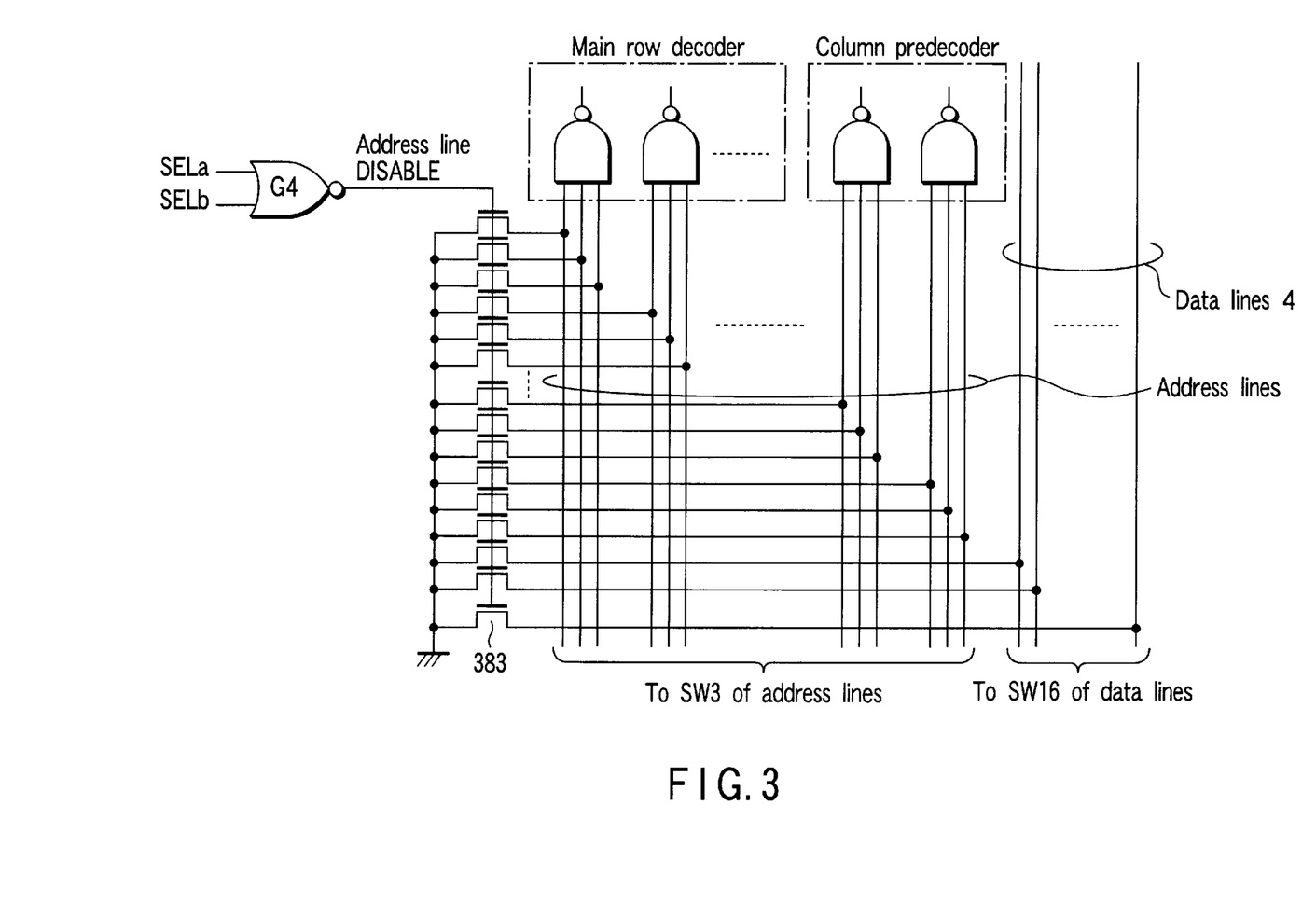
FIG. 3 shows an exemplary arrangement of the circuit for forcibly grounding address lines and data lines in each of nonselected cores in FIG. 1 through a signal DISABLE.

FIG. 3 shows an example of a circuit that forces the address lines in the non-selected core to be connected to ground by the signal DISABLE shown in FIG. 2.

As shown, short-circuiting transistors 383 are provided in each core which connect the address lines and the data lines 4 to ground. These transistors are controlled by the NOR gate G4. When the corresponding core is non-selected, the signal DISABLE is at a high level, allowing the short-circuiting transistors 383 to be turned on and hence charges on all the address and data lines in that core to be discharged.

The above operation prevents the address and data lines in non-selected cores from being set floating. As a result, it becomes possible to prevent malfunctions, gate-oxide breakdown, and data destruction due to electrostatic noise and the like.

The address line switching circuit shown in FIG. 2 uses a scheme by which, when the two core select signals SELa and SELb are both low, the address line switch groups 31a and 31b are both turned off, preventing unwanted wiring capacitance of non-selected cores from being coupled to the read address bus 6a and the write/erase address bus 6b. As an alternative, the switch groups 31a and 31b may be controlled by the enable signals ENBa and ENBb, respectively.

Figure 4:
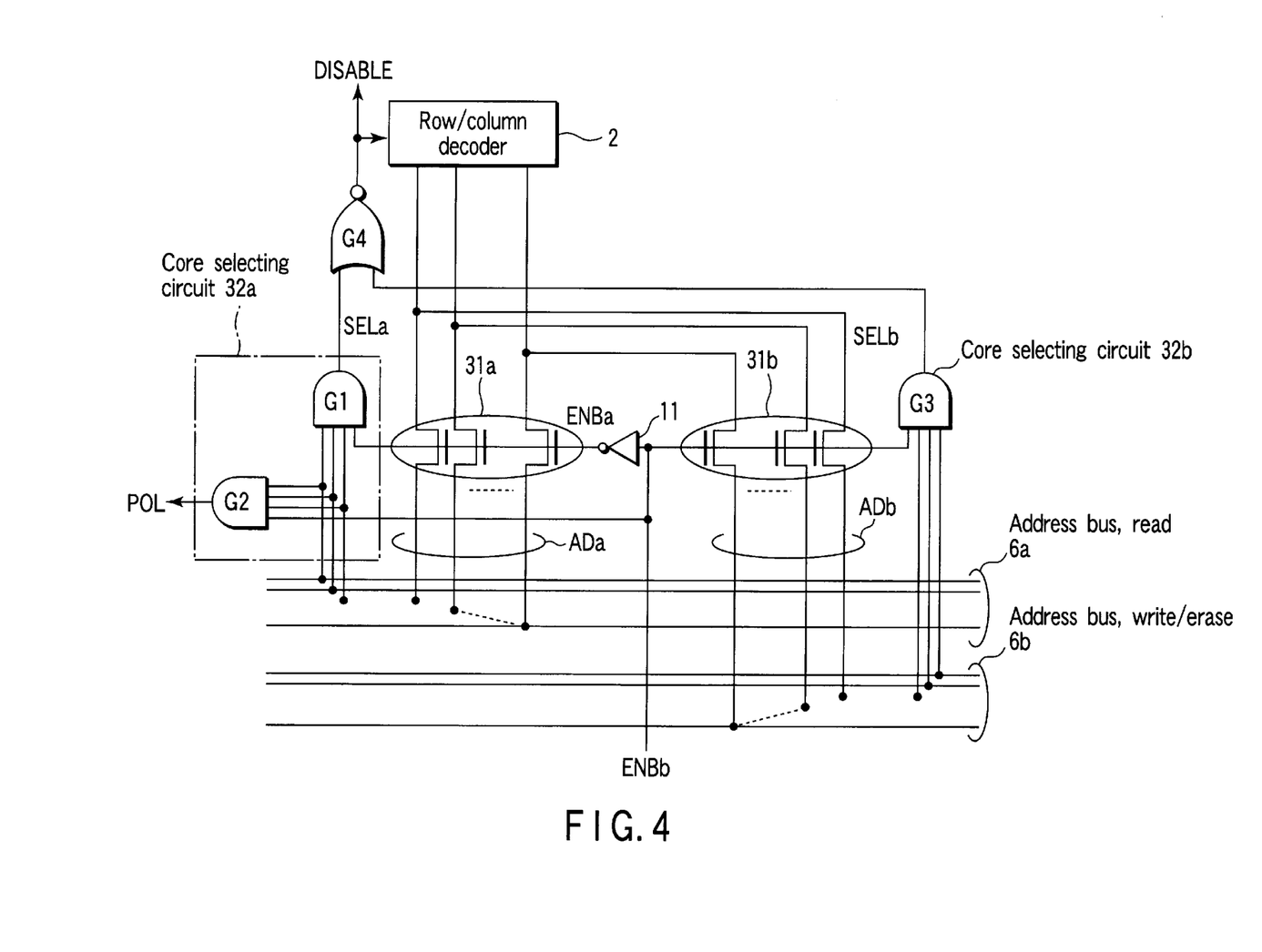
FIG. 4 shows another exemplary arrangement of the address line switch circuit in each of the cores of FIG. 1.

The address line switching arrangement of the address line/power supply line switching circuit 3 in each core based on the alternative scheme is illustrated in FIG. 4.

In this address line switching circuit, when the corresponding core is subjected to a write/erase operation, the address line switch group 31b is turned on, allowing write/erase address information ADb on the write/erase address bus 6b to be applied to the row/column decoder 2. In contrast, when no write/erase operation is carried out in the corresponding core, the address line switch group 31a is turned on all the time, allowing read address information ADa on the read address bus 6a to be applied to the row/column decoder 2. In non-selected cores, the disable signal DISABLE is set high, disabling the row/column decoder 2 and causing the data lines to be discharged.

With this system, there is no need of turning on the address line switch group 31a in reading data, which allows the switching time to be neglected and data readout to be increased in speed.

Figure 5:
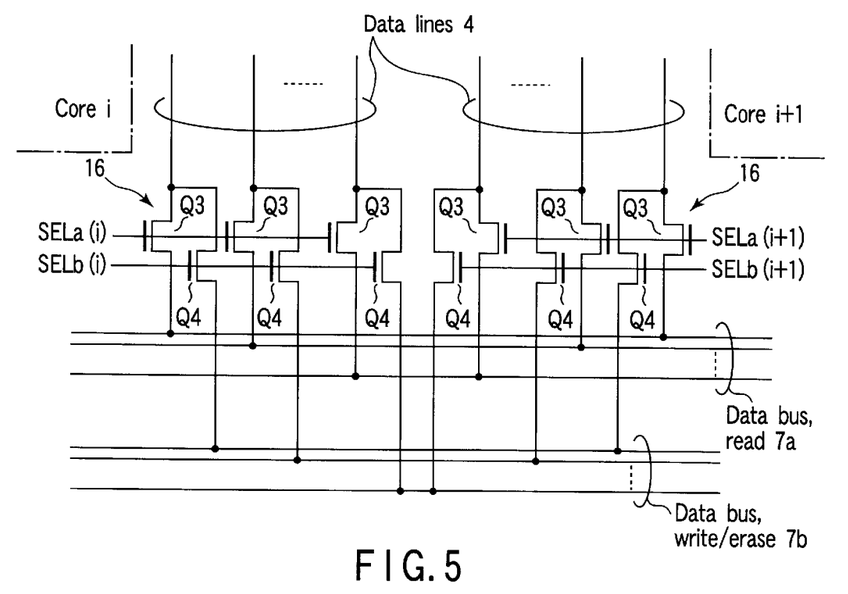
FIG. 5 shows an exemplary arrangement of the data line switching circuits associated with adjacent cores i and i+1 in FIG. 1.

FIG. 5 shows the arrangement of the data line switch circuits 16 associated with the cores i and i+1, which selectively connect their local data lines 4 to either the read data bus 7a or the write/erase data bus 7b.

A group of NMOS transistors Q3, when turned on by the core select signal SELa output from the core select circuit 32a, connects the local data lines 4 to the read data bus 7a. A group of NMOS transistors Q4, when turned on by the core select signal SELb output from the core select circuit 32b, connects the local data lines 4 to the read data bus 7b.

When a certain core (i) is in the write/erase mode, the core select signal SELb(i) in that core is at a high level. Thus, the transistors Q4 in the corresponding data line switching circuit are turned on, allowing the corresponding local data lines 4 to be connected to the write/erase data bus 7b. When the core (i) is in the read mode, on the other hand, the corresponding core select signal SELa(i) is at a high level, turning on the transistors Q3 in the corresponding data line switching circuit, thereby allowing the corresponding local data lines 4 to be connected to the read data bus 7a.

Figure 6:
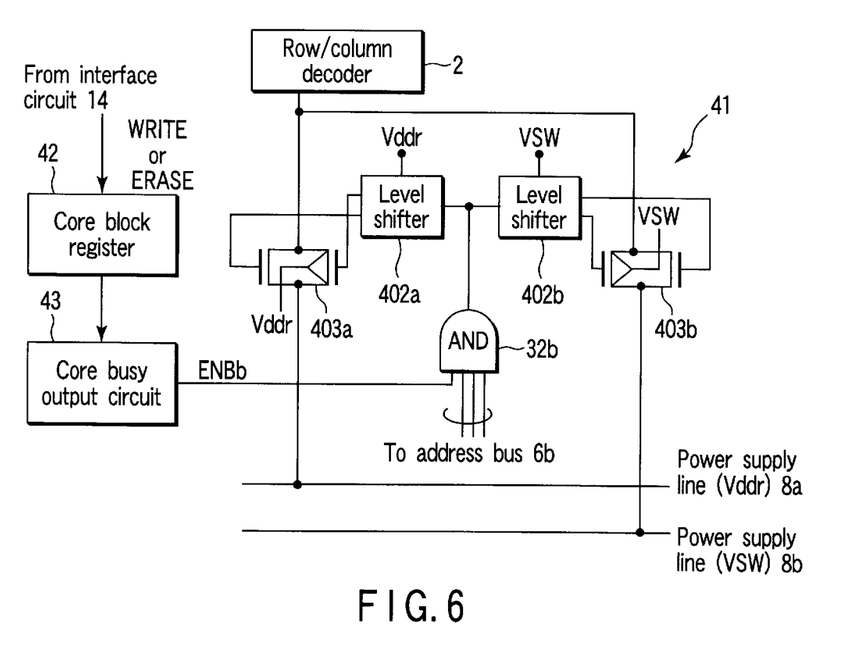
FIG. 6 shows an exemplary power supply line switching arrangement of power supply line switching circuit in each of the cores of FIG. 1.

FIG. 6 shows the power supply line switching arrangement in power supply line switching circuit 3 in each core of FIG. 1. In this figure, there is additionally illustrated the arrangement for producing the enable signal ENBb, which is omitted in FIG. 2.

This power supply line switching circuit, indicated at 41, comprises level shifters 402a and 402b which are selectively activated by the core select circuit 32b in the switching circuit 3 shown in FIG. 2 and transfer gates 403a and 403b which are controlled by the level shifters 402a and 402b, respectively. The transfer gates 403a and 403b, when enabled, connect the read power supply line 8a and the write/erase power supply line 8b, respectively, to the row/column decoder 2.

For example, when the core select signal SELb from the core select circuit 32b is at a high level, i.e., when the corresponding core is in the write/erase mode, the level shifter 402b is activated. As a result, a level-shifted control signal is obtained from the level shifter 402b, turning on the transfer gate 403b, thereby allowing the write/erase supply potential (e.g., boosted potential VSW) on the write/erase power supply line 8b to be applied to the row/column decoder 2.

When the corresponding core is in the read mode, the core select signal SELb is at a low level. In this state, the level shifter 402a is activated, turning on the transfer gate 403a. Thereby, the read supply potential Vddr on the read power supply line 8a is applied through the transfer gate 403a to the row/column decoder 2.

A data write signal WRITE or erase signal ERASE obtained by decoding a command in the interface circuit 14 is held in a core block register 42 installed in each core as information indicating which block to be written into or erased. Based on the information in the core block register 42, a core busy output circuit 43 outputs an enable signal ENBb at a high level as a busy output indicating the corresponding core is in the write/erase mode.

Figures 7, 8:
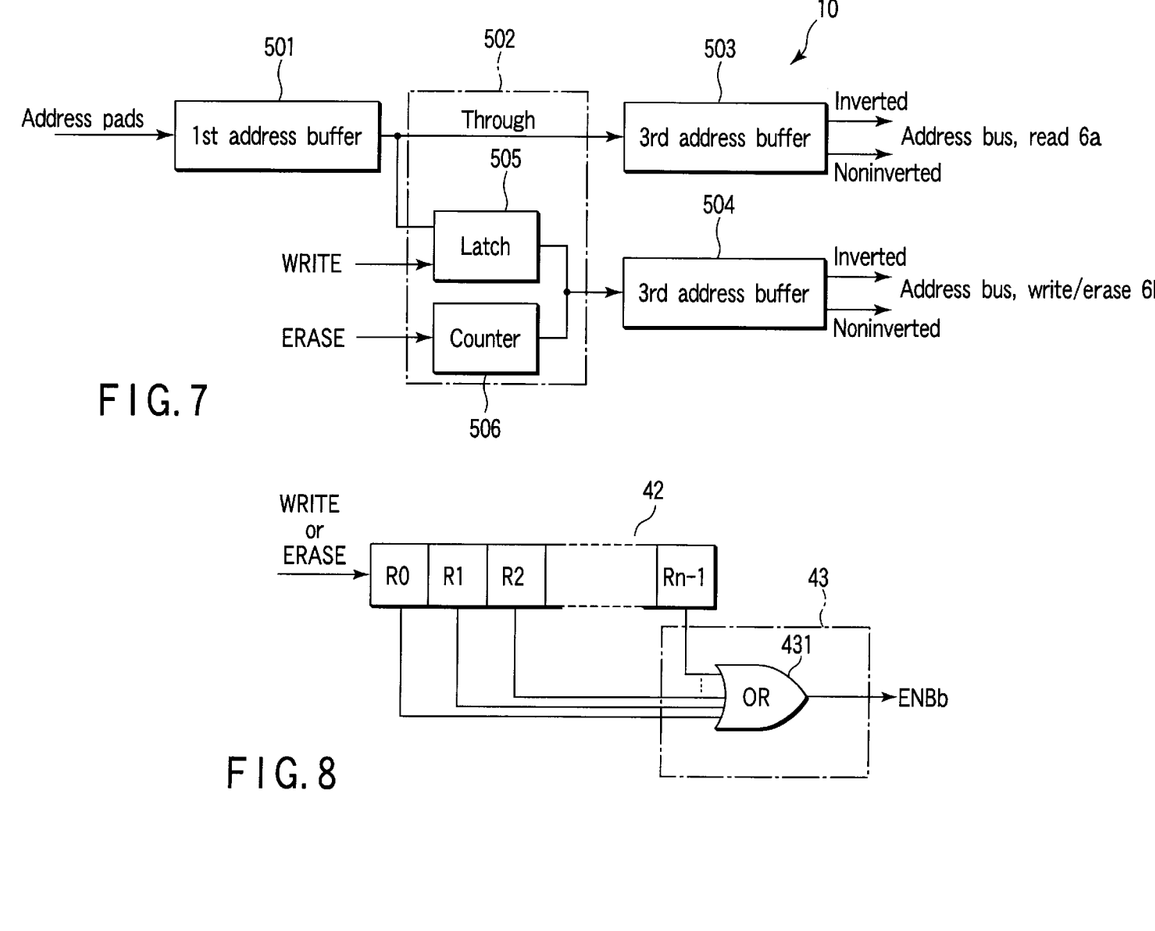
FIG. 7 is a block diagram of the address buffer in FIG. 1.
FIG. 8 shows an exemplary arrangement of the core block register and the core busy output circuit in FIG. 6.

FIG. 7 shows the arrangement of the address buffer 10 in FIG. 1.

The address buffer 10 has a first buffer 501, a second buffer 502, and third buffers 503 and 504. The first buffer 501 has a function of reducing noise in externally applied address information and internally protecting the information. The second buffer 502 allows the input address information to pass through to the third buffer 503 on one hand and to enter a latch circuit 505 on the other hand.

In the read mode, the address information allowed to pass through the second buffer 502 is converted into complementary signals in the third buffer 503 and then applied to the read address bus 6a. In the write mode, on the other hand, the address information is held in the latch circuit 505 until the termination of the operation. The address information is converted into complementary signals in the third buffer 504 and then applied to the write/erase address buffer 6b.

A counter 506 in the second buffer 502 is adapted to increment the address at the time of a verify operation in the erase mode. That is to say, in erase verification, sequentially updated address information is applied through the buffer 504 to the write/erase address bus 6b.

FIG. 8 shows the arrangement of the core block register 42 and the core busy output circuit 43 in FIG. 6.

The core block register 42 has stages R0 to Rn−1 the number of which is equal to the number n of the blocks in the corresponding core. Upon entry of a write signal WRITE or erase signal ERASE, the flag at a high level is held in the register stage corresponding to a selected block in the corresponding core until the operation terminates. The core busy output circuit 43 has an OR gate 431 that ORs the outputs of the respective stages of the core block register 42. In the corresponding core, when at least one block to be written into or erased is selected, the OR gate 431 in the core busy output circuit 43 outputs a core busy signal at a high level (i.e., the write or erase enable signal ENBb). In non-selected cores, the enable signal ENBb is low, indicating that the cores are read enabled.

Figure 9:
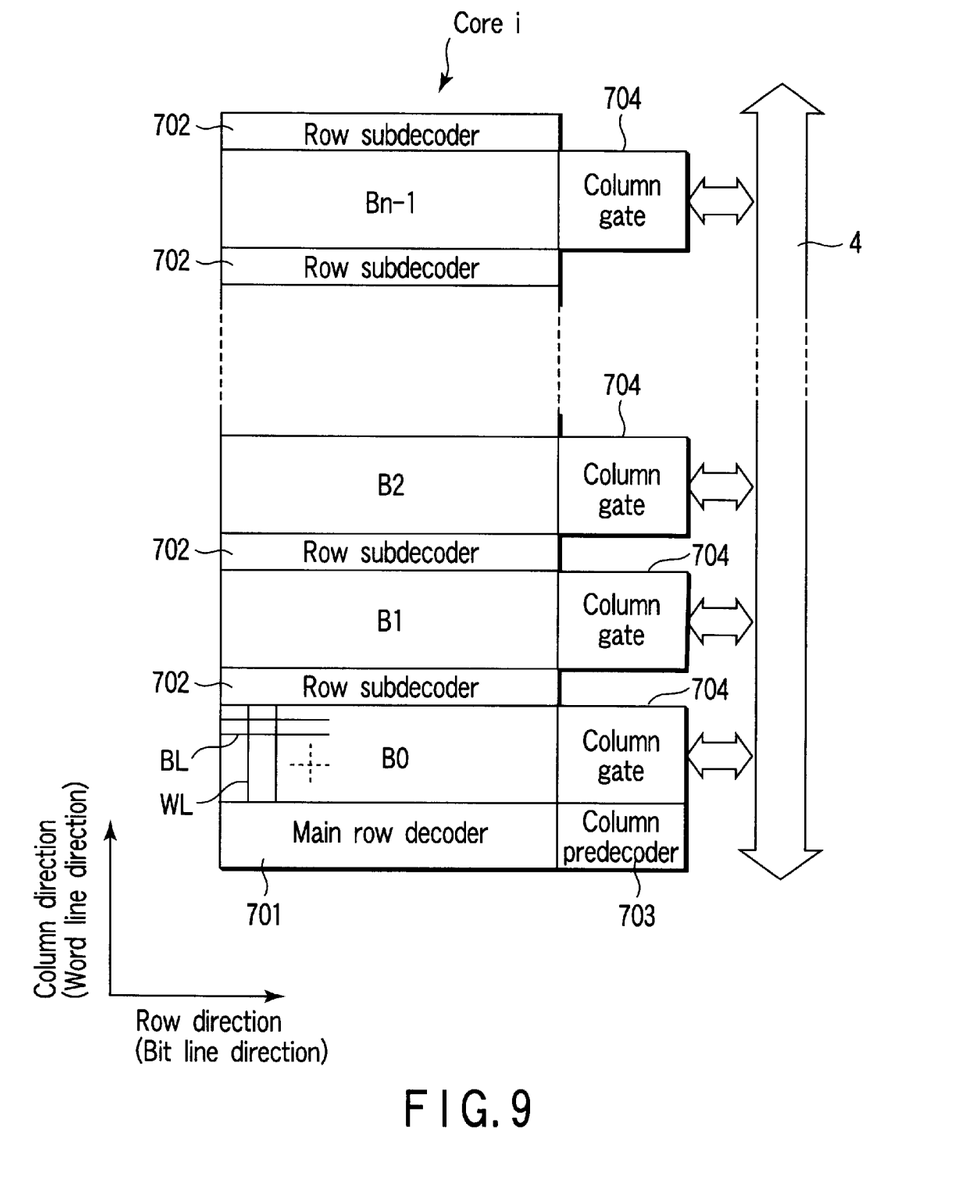
FIG. 9 shows an exemplary configuration of each of the cores in FIG. 1.
Figure 10:
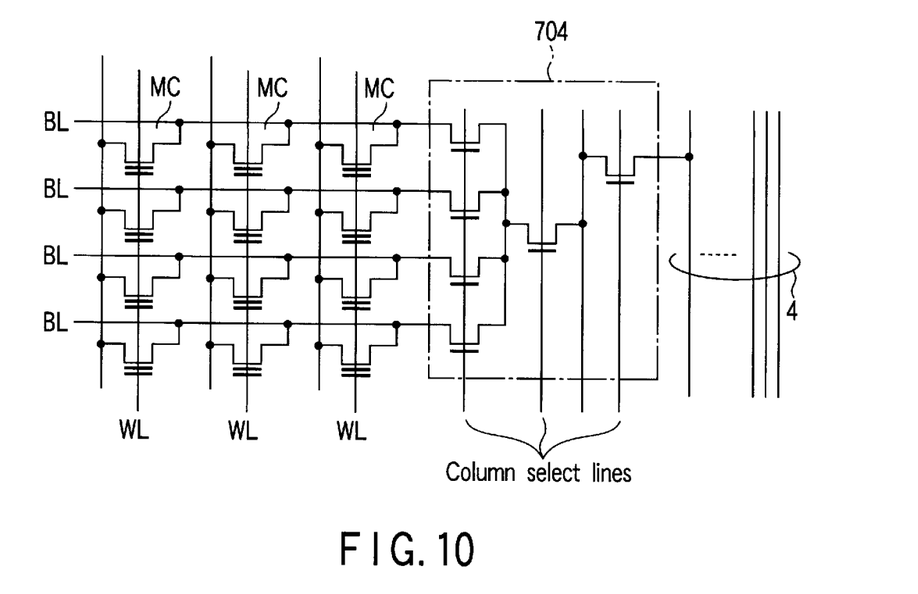
FIG. 10 shows an exemplary arrangement of each block in FIG. 9.

FIG. 9 shows the arrangement of each core in FIG. 1 and FIG. 10 shows the arrangement of each block in FIG. 1.

Each of blocks B0 to Bn−1 in FIG. 9 is composed of bit lines BL and word lines WL arranged to intersect and memory cells placed at intersections of the bit and word lines. Each block has word lines and bit lines arranged continuously to form a unit of batch erasing. At one end of the arrangement of the blocks B0 to Bn−1 in the column direction is placed a main row decoder 701 that makes a selection from the word lines. Between each block is placed a row subdecoder 702 for block selection. A column decoder is placed at one end of the arrangement of the blocks in the row direction and composed of column gates 704 each of which is placed at one end of the corresponding block in the row direction and a column predecoder 703.

Figure 11:
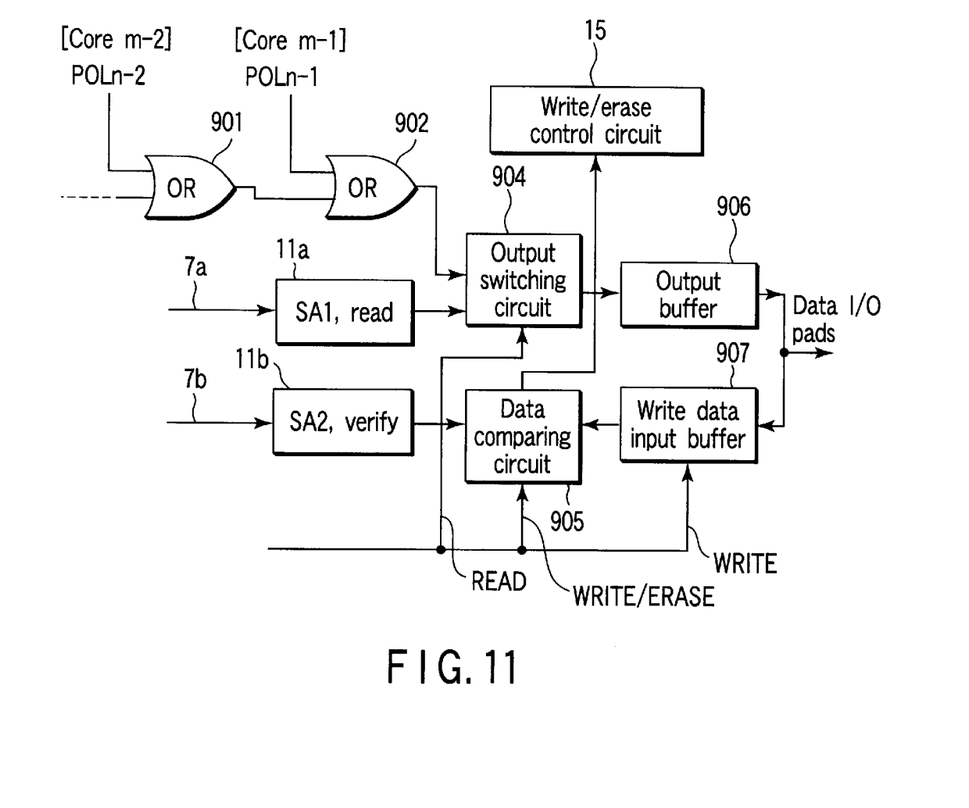
FIG. 11 shows an exemplary arrangement of the I/O circuit between external I/O pads and each of the read sense amplifier SA1 and the verify sense amplifier SA2 in FIG. 1.

FIG. 11 shows the arrangement of an I/O circuit connected between the sense amplifiers 11a and 11b in FIG. 1 and external I/O pads.

OR gates 901 and 902 form a data polling output circuit for adding the DATA polling signals POLi (i=0 to m−1) output from the core select circuits 32a of the respective cores described in connection with FIG. 2.

An output switching circuit 904 selectively sends either the output of the read sense amplifier 11a or the data polling signal to an output buffer 906.

A data comparing circuit 905 checks output data read by the verify sense amplifier 11b for write/erase verification in a write/erase operation. In a write operation, a comparison is made between write data from an input buffer 907 and read data for write verification. The result is presented to the write/erase control circuit 15. If a mismatch occurs, then rewriting control will be performed. In an erase operation as well, at the occurrence of a mismatch, erasing will be performed again.

The concurrent execution of a write operation and a read operation in the flash memory thus configured will be described hereinafter in terms of an operation of, during writing into a certain core, reading from another core.

When a write command is input to the chip, the write flag WRITE is output from the interface circuit 14. In response to this internal signal, the address buffer 10 latches the address of a memory cell to be written into until the termination of writing and outputs the latched address data onto the write/erase address bus 6b. At the same time, information on the block containing the cell to be written into is written into the corresponding stage of the core block register 42 as busy information (high).

Let the core thus selected be the core A. In the core A, its core busy output circuit 43 provides a core busy output at a high level (i.e., the enable signal ENBb at a high level). Thus, the core select signal SELb in the core A goes high, inhibiting a read request to the core A.

The enable signal ENBb and the core select signal SELb allow the write address information on the write/erase address bus 6b to be input to the decoder 2 in the core A, the supply potential on the write/erase power supply line 8b to be input to the decoder 2 in the core A for the power supply thereof, and the write/erase data bus 7b to be connected to the data lines 4 in the core A. Thereby, writing into the selected memory cell in the selected core A is executed.

In the write mode, the write loading circuit is controlled according to the write data input from the I/O pads and latched in the data comparator circuit 905 through the input buffer 907. During that time, when a request is made for reading from a memory cell in the core B other than the core A, data is read from the core B because both the core busy output, i.e., the enable signal ENBb, and the core select signal SELb are low in the core B.

That is, the address information on the read address bus 6a is applied to the row/column decoder 2 in the core B and at the same time that decoder is supplied with the read supply potential. Data is read from the selected memory cell onto the data lines 4 and then transferred over the read data bus 7a to the read sense amplifier 11a.

When a read address is input which corresponds to the address of a memory cell in the core A which is being written into, the data polling signal POL in the core A goes high because the enable signal ENBb is high in the core A. This polling signal is output from the output switching circuit 904 to outside.

A read operation can be executed on any other core than the core A which is being written into, eliminating restrictions on bank area.

Next, data reading during data erasing will be described.

Upon receiving a data erase command, the interface circuit 14 outputs the erase flag ERASE. Thereby, busy information (high) is written into the block register in the core to be erased. At the same time, the counter 506 in the address buffer 10 is operated to search through all the block registers in sequence. When a match is found with the address of the core A containing the block for which the busy information has been written into, the core select signal SELb goes high. As a result, the erasing supply voltage on the write/erase power supply line 8b and the address on the write/erase address bus 6b are applied to the decoder in the core A and the local data lines are connected to the write/ erase data bus 7b. Thus, the erasing voltage is applied to the block to be erased. After that, the memory cells in that block are subjected to erase verification in sequence as the counter 506 is incremented.

The operation of the data polling circuit will be described next. When a command to read from the core A is entered while it is written into or erased, the enable signal ENBa and the select signal SELa in the core A are both low; thus, the core A is read disabled. At this point, in the core A the data polling signal POL is at a high level, which is input to the output switching circuit 904. The output switching circuit 904 supplies the output buffer 906 with polling data, not the output of the sense amplifier 11a.

Figure 12:
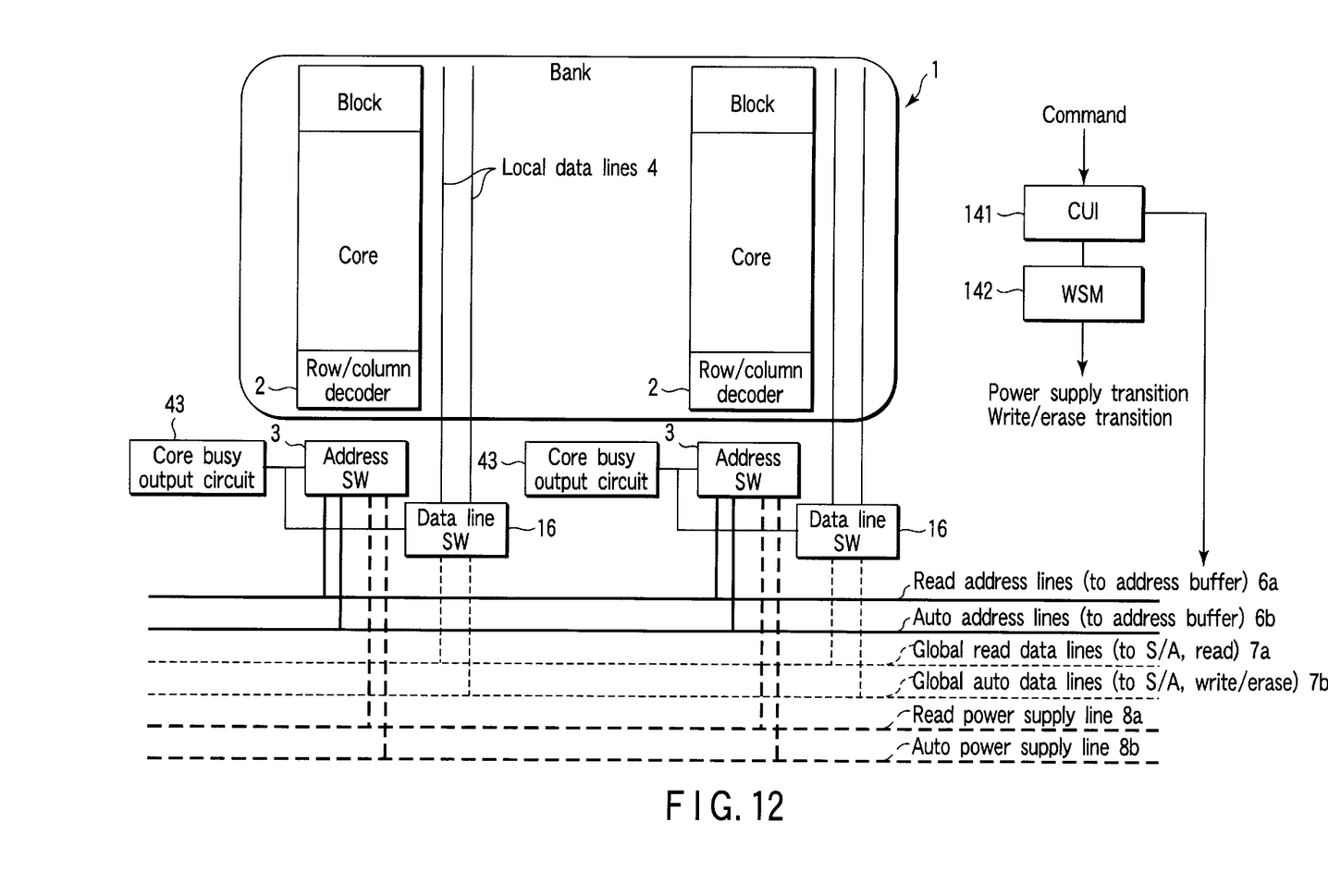
FIG. 12 is a block diagram of a system configuration formed on the chip of the flash memory of the first embodiment of the present invention.

FIG. 12 shows a portion of a system configuration formed on the chip of a flash memory according to an embodiment of the present invention. This system configuration remains basically unchanged from the concurrent operation executable flash memory shown in FIG. 1.

In FIG. 12, the memory cell section 1 has memory cells placed in an array form and a row/column decoder 2 is provided for each minimum erase unit (block). A plurality of blocks, a row/column predecoder (not shown) common to the blocks and data lines (local data lines) 4 comprise one core. One or more cores constitute a bank.

Each core has a core block register (not shown, corresponding to the register 42 in FIG. 6) which holds the write flag or erase flag while its block is subjected to a write/erase operation. There is further provided a core busy output circuit 43 (corresponding to the circuit 43 in FIG. 6) that watches the flag in the core block register and outputs a core busy signal as a write/erase enable signal when a block in the corresponding core is being written into or erased. A signal opposite in polarity to the core busy signal is taken as a ready signal.

In the vicinity of the bank are placed a read address lines 6a, a write/erase address lines (auto address lines) 6b, a read data lines (global read data lines) 7a, a write/erase data lines (global auto data lines) 7b, a read power supply line 8a, and a write/erase (auto) power supply line 8b.

The address lines 6a and 6b are connected to the address buffer. The global read data lines 7a is connected to the read sense amplifier. The global auto data lines 7b is connected to the write/erase (auto) sense amplifier.

The address/power supply switch 3 in each core is controlled the busy signal and the core select signal. When the corresponding core is busy, the switch connects the corresponding row/column decoder 2 to the auto address lines 6b and the auto power supply line 8b. When the corresponding core is in the ready state, the switch connects the corresponding row/column decoder 2 to the read address lines 6a and the read power supply line 8b. Thereby, a selected cell becomes applied with a desired potential.

The data line switch 16 in each core is controlled by the busy signal and the core select signal. When a ready core is selected, the switch connects the local data lines 4 to the global read data lines 7a; otherwise, the switch does not connect the local data lines to the global read data lines. When a busy core is selected, the switch connects the local data lines 4 to the global auto data lines 7b; otherwise, the switch does not connect the local data lines to the global auto data lines.

There are further provided a control circuit (Command User Interface: CUI) 141 that accepts command inputs from outside and a control circuit (Write State Machine: WSM) 32 that synchronously takes in commands which are asynchronously output from the CUI 141 and automatically controls the write/erase transition.

The flash memory described above remains basically unchanged from the concurrent operation executable flash memory shown in FIG. 1. The address lines, the data lines and the sense amplifiers are separated into ones for writing/erasing and ones for reading. A core to be written into or erased is controlled by the busy signal and hence does not interfere with a core to be read from, thus preventing multiple selection.

Figure 13:
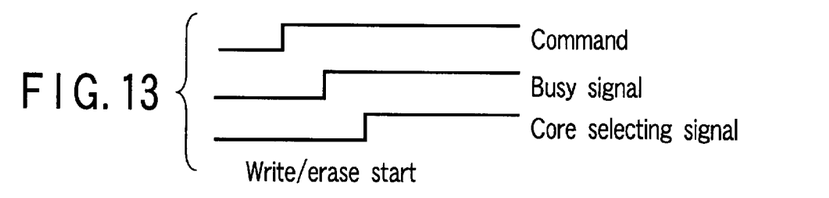
FIG. 13 shows an exemplary timing relationship among control signals for preventing multiple selection at the start of a write/erase operation in the flash memory.

(1) Timing relationship among control signals at the start of a write/erase operation FIG. 13 is a timing diagram of control signals for preventing multiple selection at the start of a write/erase operation in the inventive flash memory.

When a write command is set, the core busy output circuit 43 in each core makes a decision of whether the corresponding core has been selected on the basis of the auto address held in the latch circuit (505 in FIG. 7) in the address buffer 10. When the corresponding core has been selected, the busy signal and the core select signal are output to connect the row/column decoder 2 to the auto power supply line 8b. As a result, a write operation is performed on a selected cell under the control of the WSM 142.

The core busy output circuit 43 has flag registers corresponding in number to blocks in each core. When an erase command is input, the flag is set in the flag register corresponding to a block to be erased. When the erase command is set, the core for which the flag has been set becomes busy.

The core having a block selected by the output of the counter (506 in FIG. 7) in the address buffer 10 outputs the core select signal to connect the row/column decoder 2 to the auto power supply line 8b. Thus, an erase operation is performed on the selected block under the control of the WSM 142.

At the start of a write/erase operation, the command is set first, the busy signal is set next, and the core select signal is set finally. This prevents address-based multiple selection of a core in the busy state and a core in the ready state. Thus, the capacitance on the core side, as viewed from the auto power supply line, is kept constant, allowing the supply voltage transient to be stabilized.

The local data lines 4 are connected to the corresponding core only when it is in the busy state. That is, causing the control signals to have such a sequential relationship as shown in FIG. 13 allows multiple selection immediately after the start of a write/erase operation to be prevented completely and a write/erase operation and a read operation to be separated completely from each other.

Figure 14:
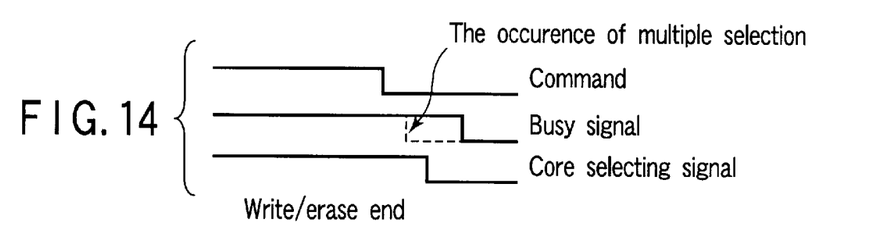
FIG. 14 shows an exemplary timing relationship among the control signals for preventing multiple selection at the termination of the write/erase operation in the flash memory.

(2) Timing relationship among control signals at the end of a write/erase operation FIG. 14 is a timing diagram of control signals for preventing multiple selection at the end of a write/erase operation in the inventive flash memory.

As indicated by solid lines in FIG. 14, the command signal is reset first, the core select signal is reset next, and the busy signal is reset finally. The resetting of the command signal is performed by resetting the CUI with a write/erase command resetting signal generated by the WSM at the end of a write/erase operation.

To this end, the core busy output circuit 43 is required to incorporate a delay circuit which, when the command is set, outputs the busy signal immediately after the command has been set and, when the command is reset, allows the busy signal to be reset after the core select signal has been reset.

Consider the case where, at the end of a write/erase operation, the command is reset first, the busy signal is reset next, and the core select signal is reset finally as indicated by dotted lines in FIG. 14. In such a case, during the interval between the moment that the busy signal is reset and the moment that the core select signal is reset, a core placed in the busy state will enter the ready state a moment. This causes multiple selection to occur between that core and another core which is being read from.

The occurrence of multiple selection would result in a variation in capacitance viewed from the read power supply line and consequently in a fluctuation in the reading potential. Also, the local data lines 4 could be multiple-selected during reading, resulting in a failure to read data correctly.

These problems can be solved by causing the control signals to be reset in such a sequence as indicated by solid lines in FIG. 14.

(3) Timing relationships among control signals at the suspending and resuming of a write/erase operation When the flash memory has a function of suspending a write/erase operation and a function of resuming the write/erase operation, desired timing relationships among the control signals for preventing multiple selection will be described below.

Figure 15:
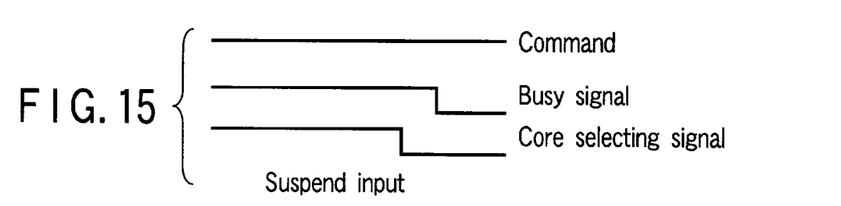
FIG. 15 shows an exemplary timing relationship among control signals for preventing multiple selection at the suspending of an write/erase operation in the flash memory.

FIG. 15 shows a multiple selection preventive timing relationship among the control signals at the suspending of a write/erase operation in the flash memory having a write/erase operation suspending function.

Figure 16:
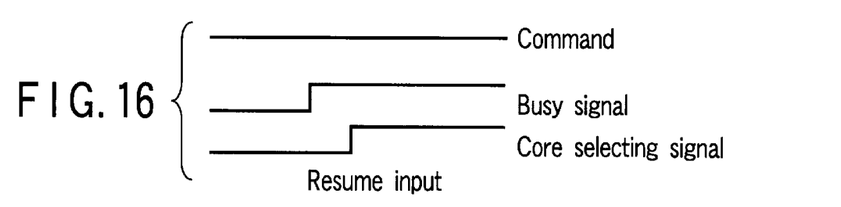
FIG. 16 shows an exemplary timing relationship among control signals for preventing multiple selection at the resuming of a write/erase operation in the flash memory.

FIG. 16 shows a multiple selection preventive timing relationship among the control signals at the resuming of a write/erase operation in the flash memory having a write/erase operation resuming function.

First, at the suspending of a write/erase operation, cell data in a non-selected block in a core which was in a write/erase operation is read mainly. In this case, it is required to switch that core from the busy state to the ready state without resetting the write/erase command. Also, since it is required to switch from the auto power supply line 8b to the read power supply line 8a, some time is needed for power supply transition. During that time, a read operation on another core may occur.

At the suspending of a write/erase operation, therefore, the core busy output circuit 43 in a core which has been subjected to the write/erase operation resets the core select signal first and the busy signal next as shown in FIG. 15.

At the resuming of the write/erase operation, the busy signal is resumed first and the core select signal is resumed next as shown in FIG. 16.

According to the semiconductor memory device of the present invention, as described above, by timing properly the control signals at the start, end, suspending or resuming of a write/erase operation, a bank in a write/erase operation and a bank in a read operation can be isolated completely from each other so that they do not interfere with each other and multiple selection of a write/erase execution bank and a read execution bank can be prevented surely. Therefore, a write/erase operation and a read operation can be executed normally and concurrently.

From the above description, in the semiconductor memory device of the present invention, it is also easy to execute a write/erase operation and a read operation normally and concurrently.

Although the configuration and operation of a semiconductor memory device of the present invention has been described in terms of one specific embodiment, the present invention is not limited to the embodiment. The semiconductor memory device of the present invention can be modified variously in configuration and operation.

Additional advantages and modifications will readily occur to those skilled in the art. Therefore, the invention in its broader aspect is not limited to the specific details and representative embodiment shown and described herein. Accordingly, various modifications may be made without departing from the spirit or scope of the general inventive concept as defined by the appended claims and their equivalents.

What is claimed is:

1. A semiconductor memory device comprising:
   a memory cell array having electrically rewritable nonvolatile memory cells and divided into a plurality of cores each of which is composed of one or more blocks each comprised of a range of memory cells as a unit of data erasure;
   a core select circuit selecting an arbitrary number of cores from said plurality of cores for data writing/erasing;
   a data write circuit writing data into selected memory cells in a core selected by said core select circuit;
   a data erase circuit erasing data in a selected block in a core selected by said core select circuit; and
   a data read circuit reading data from memory cells in a core which is not selected by said core select circuit,
   the sequence in which, at the start of a write/erase operation, a command to write into/erase or read from a core, a core select signal indicating whether or not the core has been selected, and a busy signal indicating that the core is in the write/erase mode are set being set so that multiple selection of a core in a write/erase operation and a core in a read operation does not occur.

2. The semiconductor memory device according to claim 1, further comprising a core busy output circuit, provided for each of said cores, outputting said busy signal associated with the corresponding core, said core busy output circuit outputting said busy signal so as to satisfy the sequential relation such that a command is set first, a busy signal is output next, and a core select signal is set finally.

3. A semiconductor memory device comprising:
   a memory cell array having a plurality of cores each of which has electrically rewritable nonvolatile memory cells and is divided into one or more cell blocks each of which forms a unit of data erasure;
   a core select circuit selecting an arbitrary number of cores from said plurality of cores for data writing/erasing;
   a data write circuit writing data into selected memory cells in a core selected by said core select circuit;
   a data erase circuit erasing data in a selected block in a core selected by said core select circuit; and
   a data read circuit reading data from memory cells in a core which is not selected by said core select circuit,
   the sequence in which, at the end of a write/erase operation, a command to write into/erase or read from a core, a core select signal indicating whether or not the core has been selected, and a busy signal indicating that the core is in the write/erase mode are reset being set so that multiple selection of a core in a write/erase operation and a core in a read operation does not occur.

4. The semiconductor memory device according to claim 3, further comprising a core busy output circuit, provided for each of said cores, outputting said busy signal associated with the corresponding core, said core busy output circuit outputting said busy signal so as to satisfy the sequential relation such that said command is reset first, said core select signal is reset next, and said busy signal is reset finally.

5. A semiconductor memory device comprising:

a memory cell array having a plurality of cores each of which has electrically rewritable nonvolatile memory cells and is divided into one or more cell blocks each of which forms a unit of data erasure;

a core select circuit selecting an arbitrary number of cores from said plurality of cores for data writing/erasing;

a data write circuit writing data into selected memory cells in a core selected by said core select circuit;

a data erase circuit erasing data in a selected block in a core selected by said core select circuit; and a data read circuit reading data from memory cells in a core which is not selected by said core select circuit, the sequence in which, at the suspending of a write/erase operation, a command to write into/erase or read from a core, a core select signal indicating whether or not the core has been selected, and a busy signal indicating that the core is in the write/erase mode are reset being set so that multiple selection of a core in a write/erase operation and a core in a read operation does not occur.

6. The semiconductor memory device according to claim 5, further comprising a core busy output circuit, provided for each of said cores, outputting said busy signal associated with the corresponding core, said core busy output circuit outputting said busy signal so as to satisfy the sequential relation such that, with said command kept set, said core select signal is reset first, and said busy signal is reset next.

7. A semiconductor memory device comprising:

a memory cell array having a plurality of cores each of which has electrically rewritable nonvolatile memory cells and is divided into one or more cell blocks each of which forms a unit of data erasure;

a core select circuit selecting an arbitrary number of cores from said plurality of cores for data writing/erasing;

a data write circuit writing data into selected memory cells in a core selected by said core select circuit;

a data erase circuit erasing data in a selected block in a core selected by said core select circuit; and a data read circuit reading data from memory cells in a core which is not selected by said core select circuit, the sequence in which, at the resuming of a write/erase operation which has been suspended, a command to write into/erase or read from a core, a core select signal indicating whether or not the core has been selected, and a busy signal indicating that the core is in the write/erase mode are set being set so that multiple selection of a core in a write/erase operation and a core in a read operation does not occur.

8. The semiconductor memory device according to claim 7, further comprising a core busy output circuit, provided for each of said cores, outputting said busy signal associated with the corresponding core, said core busy output circuit outputting said busy signal so as to satisfy the sequential relation such that said busy signal is output first, and said core select signal is set next.

9. A semiconductor memory device comprising:

a memory cell array having a plurality of cores each of which has electrically rewritable nonvolatile memory cells and is divided into one or more cell blocks each of which forms a unit of data erasure;

a core select circuit selecting an arbitrary number of cores from said plurality of cores for data writing/erasing;

a data write circuit writing data into selected memory cells in a core selected by said core select circuit;

a data erase circuit erasing data in a selected block in a core selected by said core select circuit; and a data read circuit reading data from memory cells in a core which is not selected by said core select circuit, the sequence in which, at the start of a write/erase operation, a command to write into/erase or read from a core, a core select signal indicating whether or not the core has been selected, and a busy signal indicating that the core is in the write/erase mode are set being set so that multiple selection of a core in a write/erase operation and a core in a read operation does not occur, the sequence in which, at the end of the write/erase operation, the command, the core select signal, and the busy signal are reset being set so that multiple selection of a core in a write/erase operation and a core in a read operation does not occur, the sequence in which, at the suspending of the write/erase operation, the command, the core select signal, and the busy signal are reset being set so that multiple selection of a core in a write/erase operation and a core in a read operation does not occur, and the sequence in which, at the resuming of the write/erase operation which has been suspended, the command, the core select signal, and the busy signal are set being set so that multiple selection of a core in a write/erase operation and a core in a read operation does not occur.

10. The semiconductor memory device according to claim 9, further comprising a core busy output circuit, provided for each of said cores, outputting said busy signal associated with the corresponding core, said core busy output circuit outputting said busy signal so as to satisfy the sequential relation such that: at the start of the write/erase operation, said command is set first, said busy signal is output next, and said core select signal is set finally; at the end of the write/erase operation, said command is reset first, said core select signal is reset next, and said busy signal is reset finally; at the suspending of the write/erase operation, with said command kept set, said core select signal is reset first, and said busy signal is reset next; and, at the time of resuming the write/erase operation, said busy signal is output first, and said core select signal is set next.

* * * * *